United States Patent
Hamada et al.

(10) Patent No.: US 8,268,153 B2
(45) Date of Patent: Sep. 18, 2012

(54) SUBSTRATE AND METHOD FOR FABRICATING THE SAME

(75) Inventors: Takahiro Hamada, Osaka (JP); Akihiro Itoh, Kyoto (JP); Nobuaki Nagao, Gifu (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/077,382

(22) Filed: Mar. 31, 2011

(65) Prior Publication Data

US 2011/0174626 A1   Jul. 21, 2011

Related U.S. Application Data

(63) Continuation of application No. PCT/JP2010/006537, filed on Nov. 8, 2010.

(30) Foreign Application Priority Data

Dec. 4, 2009   (JP) .................................. 2009-276281

(51) Int. Cl.
  *H01M 4/02* (2006.01)
  *C25D 5/54* (2006.01)
  *C25D 3/56* (2006.01)
(52) U.S. Cl. ........................... 205/57; 205/159; 205/244
(58) Field of Classification Search ................ 205/57, 205/159, 205, 244
  See application file for complete search history.

(56) References Cited

U.S. PATENT DOCUMENTS

| | | | |
|---|---|---|---|
| 6,860,982 B2 * | 3/2005 | Okura et al. | ................ 205/333 |
| 2002/0139688 A1 | 10/2002 | Okura et al. | |
| 2003/0033974 A1 | 2/2003 | Ueda | |
| 2005/0081912 A1 | 4/2005 | Okura et al. | |
| 2010/0320450 A1 | 12/2010 | Fujioka | |

FOREIGN PATENT DOCUMENTS

| | | |
|---|---|---|
| JP | 2000-199097 | 7/2000 |
| JP | 2002-356400 | 12/2002 |
| JP | 2003-119100 | 4/2003 |
| JP | 2009-200207 | 9/2009 |

OTHER PUBLICATIONS

R. Paszkiewicz et al., "Properties of MOVPE GaN grown on ZnO deposited on Si(0 0 1) and Si(1 1 1) substrates", Journal of Crystal Growth 310 (2008), pp. 4891-4895.

Y.H. Yang et al., "ZnO nanowire and amorphous diamond nanocomposites and field emission enhancement", Chemical Physics Letters 403 (2005), pp. 248-251.

* cited by examiner

*Primary Examiner* — Luan Van

(74) *Attorney, Agent, or Firm* — McDermott Will & Emery LLP

(57) ABSTRACT

A single crystal of zinc oxide which is c-axis oriented with use of electrolytic deposition method is formed on an amorphous carbon layer, after the amorphous carbon layer is provided on an inexpensive graphite substrate. The amorphous carbon layer is provided by oxidizing the surface of the graphite substrate.

1 Claim, 6 Drawing Sheets

200nm (b)

(110) PLANE (100) PLANE

SUBSTRATE AND METHOD FOR FABRICATING THE SAME

This is a continuation of International Application No. PCT/JP2010/006537, with an international filing date of Nov. 8, 2010, which claims priority of Japanese Patent Application No. 2009-276281, filed on Dec. 4, 2009, the contents of which are hereby incorporated by reference.

BACKGROUND OF THE INVENTION

1. Field of the Invention

The present disclosure relates to a substrate on which a monocrystalline ZnO is formed. The substrate can be used for fabricating a light-emitting diode element, a solar cell, and an electric device using semiconductor such as gallium nitride (GaN) or zinc oxide (ZnO).

2. Description of the Related Art

Recently, a semiconductor element composed of a nitride semiconductor such as gallium nitride (GaN) has been researched and developed actively. A semiconductor light-emitting element composed of the nitride semiconductor comprising aluminum nitride (AlN), gallium nitride (GaN) or indium nitride (InN), or mixed crystal thereof emits light in a wide wavelength region from ultraviolet or blue to infrared by varying its film composition. A visible-range light-emitting diode using the nitride semiconductor has already been commercially-available. In order to suppress the carrier recombination due to non-luminescence transition derived from lattice defects or penetrating cracks, a nitride semiconductor film having significantly low defects in the crystal has to be prepared. This requires a monocrystalline substrate such as a sapphire substrate, but such a monocrystalline substrate is very expensive.

Japanese Laid-open patent publication No. 2009-200207 (Hereinafter, Patent Document 1) attempting to solve the above-mentioned problem discloses a method for preparing a polycrystalline nitride semiconductor film on a graphite substrate by a pulse sputtering method. However, since the GaN film obtained in accordance with Patent Document 1 is polycrystalline having many grain boundaries in the crystal, it is not suitable for preparing a light-emitting diode with high performance.

Both of GaN and ZnO have a wurtzite-type crystal structure. The a-axis mismatch factor between GaN and ZnO is 1.8%. The c-axis mismatch factor therebetween is 0.4%. Both of these values are very small.

Accordingly, a ZnO monocrystalline substrate is useful not only as a substrate for homoepitaxial growth to form a ZnO semiconductor layer but also as a substrate for heteroepitaxial growth to form a GaN semiconductor layer. Thus, the light-emitting diode element having the ZnO semiconductor layer or the GaN semiconductor layer formed on the ZnO monocrystalline substrate has been propos ed.

The ZnO monocrystalline substrate necessary to form a high quality semiconductor such as GaN or ZnO is, however, very expensive. Furthermore, it is difficult to fabricate a ZnO monocrystalline substrate with large area.

As method for forming a ZnO substrate, a vacuum film-forming method such as a sputtering method, a reactive plasma deposition method, a metal organic chemical vapor deposition (MOCVD) method, a pulse laser deposition method, or a molecular beam epitaxy method has been utilized. In order to form a monocrystalline ZnO with a small amount of defects by the vacuum film-forming method, it is necessary to introduce oxygen and to heat a substrate to approximately 500 to 800 degrees Celsius. In such a high temperature oxidation atmosphere, when a graphite substrate is utilized, the graphite substrate is easy to be deteriorated. Accordingly, it is difficult to prepare the monocrystalline ZnO on the graphite substrate.

SUMMARY OF THE INVENTION

As one of the objectives to solve the aforementioned problem, the present disclosure provides a substrate having the monocrystalline ZnO with the use of a graphite substrate, which is a non-monocrystalline substrate, by electrolytic deposition method in an aqueous solution containing zinc ion.

The method of the present disclosure is a method for fabricating a substrate, comprising the following steps (a) and (b) in this order:

a step (a) of treating a surface of a graphite substrate with oxygen-asking and forming an amorphous carbon layer on the surface of the graphite substrate, and a step (b) of forming a monocrystalline ZnO layer on the formed amorphous carbon layer by an electrolytic deposition method, wherein the amorphous carbon layer has a thickness of not less than 3 nm and not more than 50 nm.

The substrate of the present disclosure comprises a graphite substrate, an amorphous carbon layer formed on the graphite substrate, and a monocrystalline ZnO layer formed on the amorphous carbon layer, wherein the amorphous carbon layer has a thickness of not less than 3 nm and not more than 50 nm.

The substrate of the present disclosure enables the fabrication of a high performance semiconductor layer such as GaN or ZnO. Accordingly, a light-emitting diode element, a solar cell, and an electric device with an excellent property which utilize the semiconductor such as GaN or ZnO are achieved.

In the following brief description of drawings, the term "photograph" means "an image".

Other features, elements, processes, steps, characteristics and advantages of the present disclosure will become more apparent from the following detailed description of preferred embodiments of the present disclosure with reference to the attached drawings.

DETAILED DESCRIPTION OF PREFERRED EMBODIMENTS

The embodiment of the present disclosure is described below with reference to the drawings.

(Embodiment 1)

Figure 1:
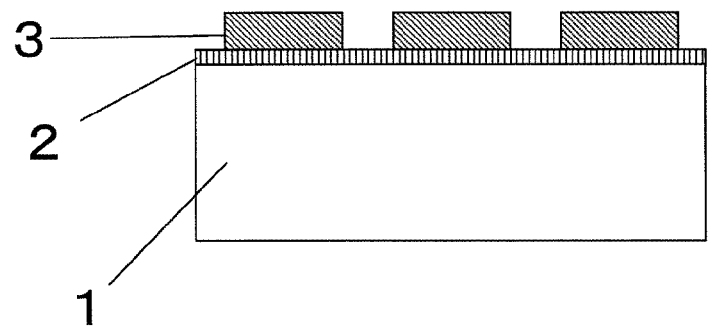
FIG. 1 shows a cross-sectional view of the substrate according to embodiment 1 of the present disclosure.

FIG. 1 shows a cross-sectional view of the substrate according to the embodiment 1.

Reference numeral 1 indicates a graphite substrate. Reference numeral 2 indicates an amorphous carbon layer formed by oxidizing the surface of the graphite substrate. Reference numeral 3 indicates a ZnO monocrystalline layer formed on the amorphous carbon layer 2 by an electrolytic deposition method.

A method for fabricating the substrate is described below with reference to the drawings.

Figure 2A:
FIGS. 2(a) and 2(b) show cross-sectional views of the process sequence of the fabrication method of the substrate according to the embodiment 1 of the present disclosure.
Figure 2B:
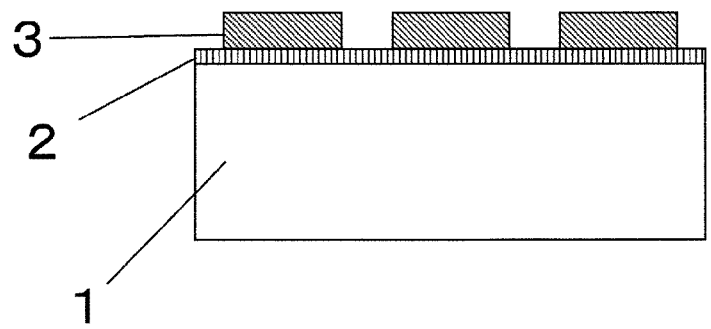

FIG. 2(a) and FIG. 2(b) show cross-sectional views of the process sequence of the method for fabricating the substrate according to the embodiment 1.

In the embodiment 1, the ZnO monocrystal is grown by the electrolytic deposition method with the use of an aqueous solution containing zinc ion.

First, as shown in FIG. 2(a), the surface of the graphite substrate 1 is oxidized so that the surface of the graphite substrate 1 is caused to be amorphous. Thus, the amorphous carbon layer 2 is formed. Next, as shown in FIG. 2(b), the ZnO monocrystal 3 is grown by the electrolytic deposition method at a low temperature of not more than 100 degrees Celsius on the amorphous carbon layer 2.

In the present embodiment 1, the c-axis oriented monocrystalline ZnO with excellent crystallinity and with a small amount of defects is formed, although the graphite substrate, which is not a monocrystalline substrate, is used.

EXAMPLE 1

The method for fabricating the ZnO by the electrolytic deposition method is described below more particularly.

Two substrates were prepared. One of them was a graphite substrate (hereinafter, referred to as "graphite substrate A") which did not have an amorphous carbon layer on its surface. The other was a graphite substrate (hereinafter, referred to as "graphite substrate B") which had an amorphous carbon layer on its surface formed by an oxygen-asking treatment.

As an electrolyte solution, a zinc nitrate aqueous solution at a concentration of 0.1 mol/L was prepared. These graphite substrates A and B were immersed in the zinc nitrate aqueous solution as working electrodes, while a platinum electrode is immersed as a counter electrode. A cathode electrolyzation with a potentiogalvanostat was performed in a condition where the temperature of the solution was 70 degrees Celsius and the current density was $-0.3$ m$\square \cdot$cm$^{-2}$ to grow a ZnO crystal. Subsequently, the substrate was drawn up and rinsed with pure water, and dried.

Figure 3A:
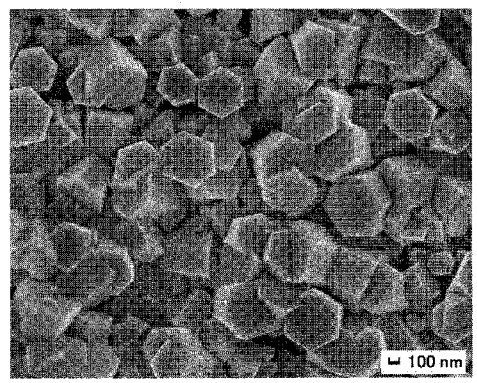
FIG. 3(a) shows a surface SEM (Scanning Electron Microscope) observation photograph when ZnO was deposited by an electrolytic deposition method on the graphite substrate where the amorphous carbon layer is not formed.
Figure 3B:
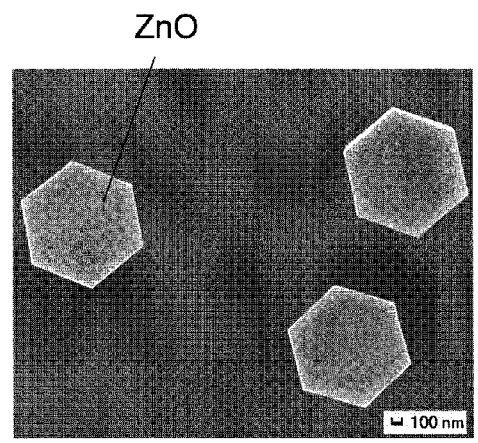
FIG. 3(b) shows a surface SEM observation photograph when ZnO was deposited by an electrolytic deposition method on the graphite substrate where the amorphous carbon layer was formed.

FIG. 3(a) shows a surface SEM observation image of the ZnO formed on the surface of the graphite substrate A by the electrolytic deposition method. FIG. 3(b) shows a surface SEM observation image of the ZnO formed on the surface of the graphite substrate B by the electrolytic deposition method.

As shown in FIG. 3(a), polycrystalline ZnO was formed on the graphite substrate A. Furthermore, crystalline particles having the shape of a hexagonal column were not oriented along the predetermined direction and were not c-axis oriented with regard to the substrate.

On the contrary, as shown in FIG. 3(b), the ZnO was formed on the graphite substrate B in such a manner that a regular hexagonal crystal face appeared clearly. Presumably, the hexagonal flat crystal face was derived from the c-face of the ZnO which has a hexagonal wurtzite-type crystal structure. In general, a crystal having facet of a hexagonal wurtzite-type crystal structure indicates high crystallinity.

Figure 4:
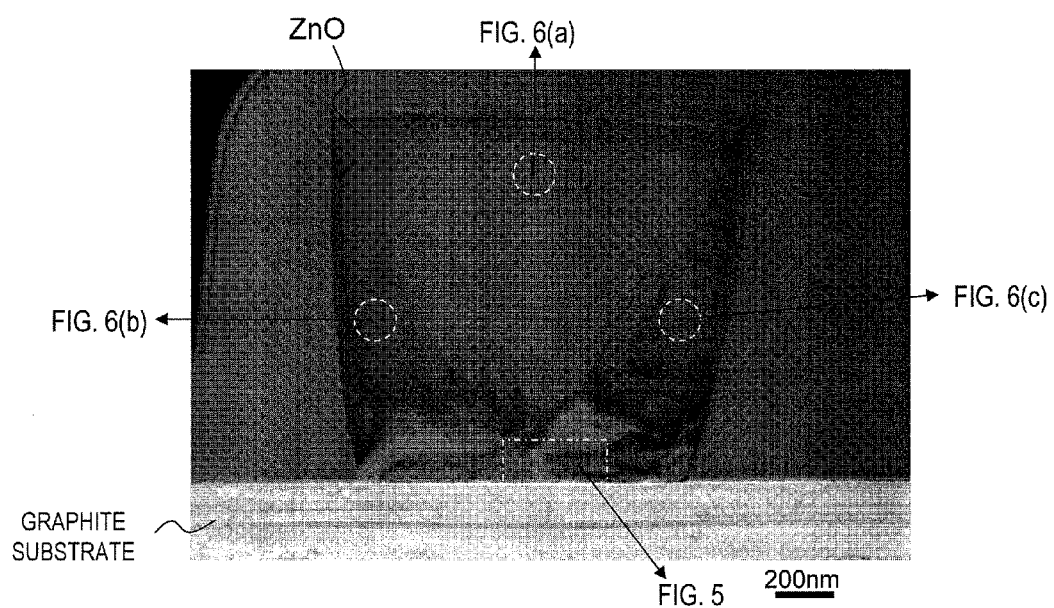
FIG. 4 shows a cross-sectional TEM (Transmission Electron Microscope) observation photograph of the ZnO formed on the graphite substrate.

FIG. 4 shows a cross-sectional TEM observation image of the ZnO monocrystal 3 grown by the electrolytic deposition method on the graphite substrate B having the amorphous carbon layer 2 with a thickness of 7 nanometers.

Figure 5:
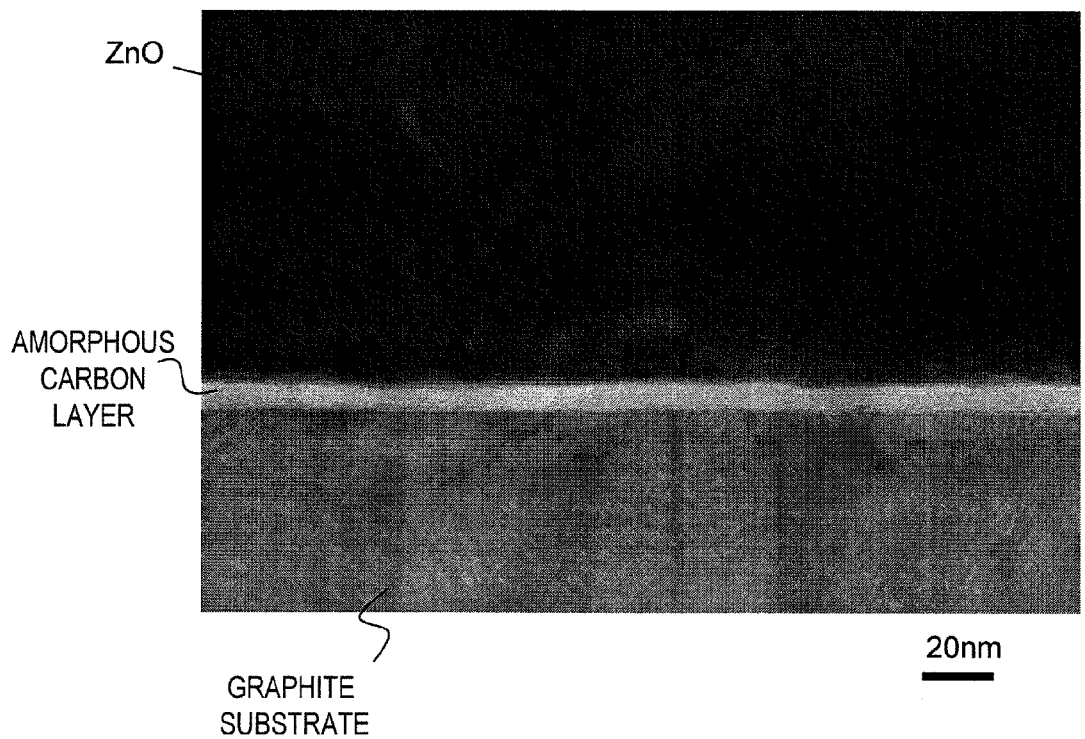
FIG. 5 shows a high-resolution TEM observation photograph in the vicinity of the interface between the graphite substrate and the ZnO.

FIG. 5 shows an enlarged image in the range shown in FIG. 4.

As is clear from FIG. 4 and FIG. 5, the ZnO monocrystal was formed on the graphite substrate 1 having the amorphous carbon layer 2 in such a manner that the ZnO monocrystal was formed perpendicularly to the substrate.

From FIG. 3(b), FIG. 4, and FIG. 5, it is considered that the ZnO monocrystal 3 having the shape of the hexagonal column was formed on the graphite substrate 1 having the amorphous carbon layer 2 in such a matter that the ZnO monocrystal 3 was c-axis oriented.

As understood from FIG. 5, the dense crystal consisting of ZnO without grain boundaries or cracks has been grown on the amorphous carbon layer 2. It was confirmed that the amorphous carbon layer 2 was consisted of carbon by an energy-dispersive X-ray spectroscopic analysis method (hereinafter, referred to as "EDS") with use of a TEM and by an electron energy loss spectroscopy analysis (hereinafter, referred to as "EELS"). A crystal lattice was not observed even when the high resolution observation was performed by a high-resolution TEM. Accordingly, it was believed that the carbon in layer 2 was an amorphous carbon which has a different structure from a crystalline graphite substrate.

Figure 6A:
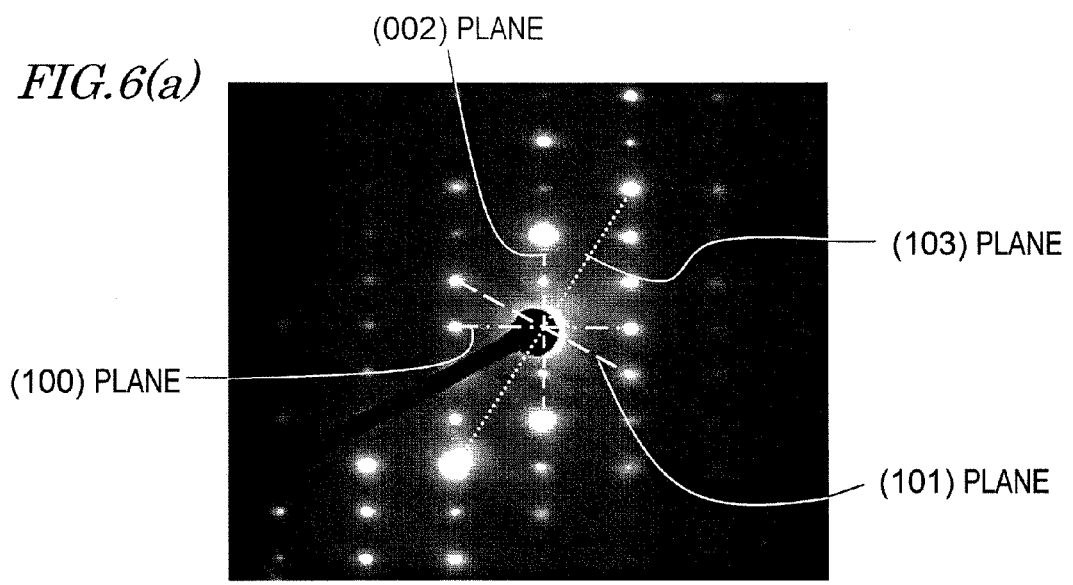
FIGS. 6(a)-6(c) show microscope photographs showing electron diffraction images by TEM in the area shown in FIG. 4.
Figure 6B:
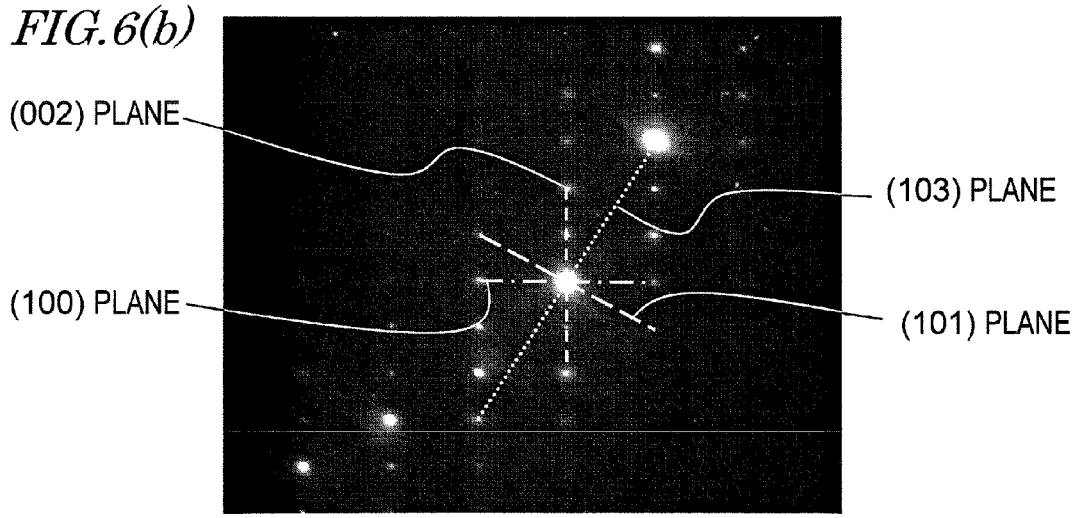
Figure 6C:
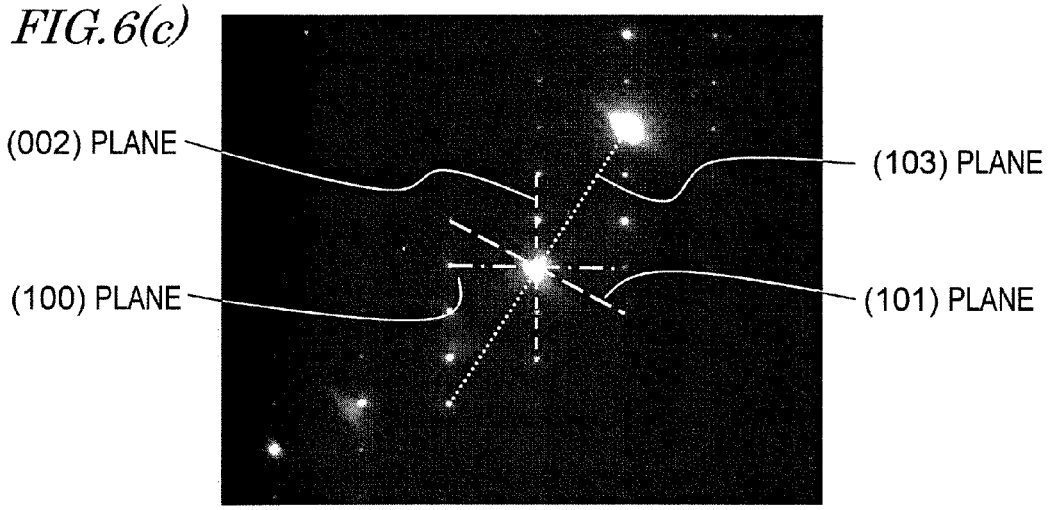

FIG. 6(a) to FIG. 6(c) show electron beam diffraction images in the range shown in FIG. 4 by TEM. From the distance and the angel formed by a diffraction spot in the electron beam diffraction images of FIG. 6(a) to FIG. 6(c), it was confirmed that the crystal was ZnO. All of the diffraction spots in the electron beam diffraction images of FIG. 6(a) to FIG. 6(c) appear clearly, and all the patterns of the diffraction spots have an identical direction. This means that crystal orientations at the three positions are identical and the entirety of the crystal is a monocrystal. Furthermore, from the direction of the (002) plane in the diffraction spots in the electron beam diffraction images of FIG. 6(a) to FIG. 6(c), it was confirmed that the ZnO was c-axis oriented with regard to the graphite substrate.

Figure 7A:
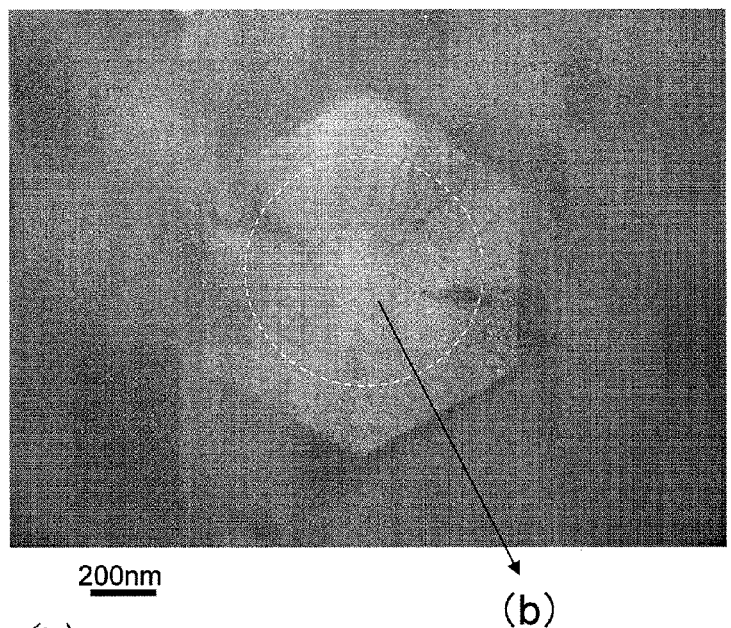
FIG. 7(a) shows a microscope photograph showing an in-plane TEM observation image of ZnO formed on the graphite substrate provided with the amorphous carbon layer.
Figure 7B:
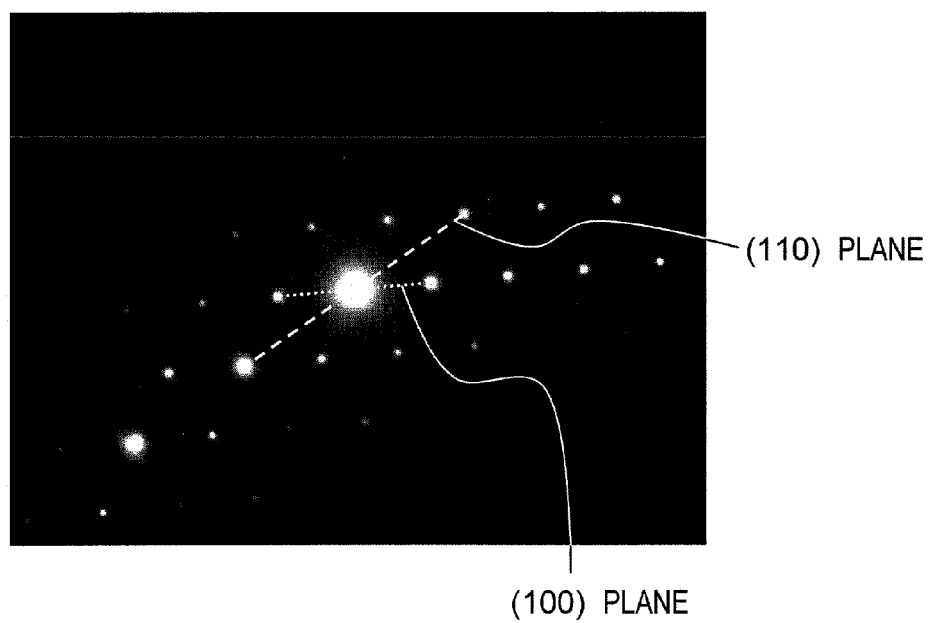
FIG. 7(b) shows a microscope photograph showing an electron diffraction image by TEM in the range shown in FIG. 7(a).

FIG. 7(a) shows an in-plane TEM observation image of the ZnO grown on the graphite substrate B having the amorphous carbon layer 2 with a thickness of 7 nanometers by the electrolytic deposition method. FIG. 7(b) shows an electron beam diffraction image in the range shown in FIG. 7(a) by TEM. In the electron beam diffraction image measured in a wide range from the plane direction, the diffraction spot appears much clearly. Thus, it was confirmed that the ZnO was a monocrystal with high quality.

Figure 8A:
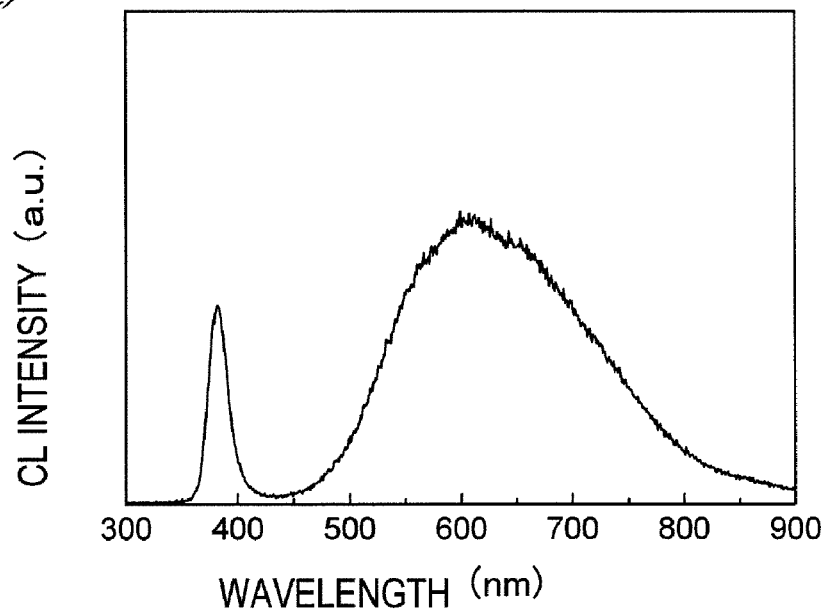
FIG. 8(a) shows a graph showing the cathode luminescence measurement result of the ZnO formed on the graphite substrate where the amorphous carbon layer was not formed by the electrolytic deposition method.
Figure 8B:
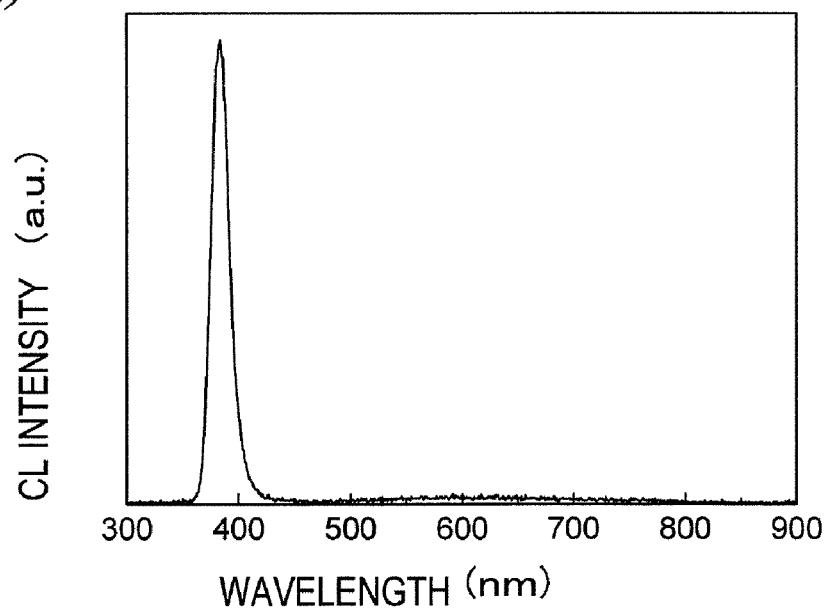
FIG. 8(b) shows a graph showing the cathode luminescence measurement result of the ZnO formed on the graphite substrate where the amorphous carbon layer was formed by the electrolytic deposition method.

FIG. 8(a) shows a measurement result of cathode luminescence excited by an electron beam, after the ZnO was formed on the graphite substrate A by the electrolytic deposition method. FIG. 8(b) shows a measurement result of cathode luminescence excited by an electron beam, after the ZnO was formed on the graphite substrate B having the amorphous carbon layer 2 with a thickness of 7 nanometers by the electrolytic deposition method.

In FIG. 8(a), not only the band-edge luminescence from the ZnO at a wavelength of 380 nanometers, but also the broad luminescence peak at a wavelength of approximately 500 to 800 nanometers derived from the crystal defects of the ZnO were observed. On the contrary, in FIG. 8(b), the broad luminescence peak at a wavelength of approximately 500 to 800 nanometers derived from the crystal defects of the ZnO were very small. Further, only the band-edge luminescence from the ZnO at a wavelength of 380 nanometers was observed strongly. From FIG. 8, it was considered that the amount of crystal defects of the ZnO was decreased because the amorphous carbon layer 2 was provided on the graphite substrate 1.

Table 1 shows the values of full width at half maximum (hereinafter, referred to as "FWHM") of the (0002) peaks obtained by rocking curves of XRD of the ZnO when the thickness of the amorphous carbon layer 2 is varied. The thickness of the amorphous carbon layer can be varied by, for example, adjusting a treatment time in the oxygen-asking.

TABLE 1

| Thickness (nm) | FWHM (arcsec) |
|---|---|
| 0 | 19440 |
| 3 | 2520 |
| 7 | 2160 |
| 30 | 2880 |
| 50 | 3240 |
| 80 | 10080 |

In a case where the amorphous carbon layer 2 had a thickness of not less than 3 nanometers and not less than 50 nanometers, the ZnO were c-axis oriented, and the FWHM values were excellent. In a case where the amorphous carbon layer 2 had a thickness of more than 80 nanometers, the surface of the graphite substrate was damaged and deteriorated during the oxygen-asking so that the growth of the c-axis orientation of the ZnO was prevented. Accordingly, it is preferred that the amorphous carbon layer 2 has a thickness of not less than 3 nanometers and not more than 50 nanometers.

From these results, the monocrystalline ZnO with significantly high crystallinity can be formed by providing the amorphous carbon layer 2 on the surface of the graphite substrate 1 and then growing the ZnO crystal with use of the electrolytic deposition method. When the ZnO monocrystal 3 is grown on the graphite substrate 1, since not a vacuum film-forming method but an electrolytic deposition method is used to manufacture the ZnO monocrystal, it is possible to obtain a ZnO monocrystal having a large area at low cost.

The substrate of the present disclosure is useful as a semiconductor substrate to form high quality semiconductor such as GaN or ZnO. Furthermore, the substrate of the present disclosure is suitable for fabricating an electric device such as a light-emitting diode element, a solar cell, or a FET for a power device.

While the present disclosure has been described with respect to preferred embodiments thereof, it will be apparent to those skilled in the art that the disclosed disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A method for fabricating a substrate, comprising the following steps (a) and (b) in order:
   (a) oxygen-ashing a surface of a graphite substrate to form an amorphous carbon layer on the surface of the graphite substrate, and
   (b) forming a monocrystalline ZnO layer on the amorphous carbon layer by electrolytic deposition method, wherein:
   the amorphous carbon layer has a thickness of not less than 3 nm and not more than 50 nm.

\* \* \* \* \*